United States Patent
Wu (10) Patent No.: US 12,316,294 B2
(45) Date of Patent: May 27, 2025

(54) HARMONIC FILTER WITH MULTI-FREQUENCY FILTERING CAPABILITIES

(71) Applicant: Schneider Toshiba Inverter Europe SAS, Pacy sur Eure (FR)

(72) Inventor: Cong Martin Wu, Pacy-sur-Eure (FR)

(73) Assignee: Schneider Toshiba Inverter Europe SAS, Pacy sur Eure (FR)

( * ) Notice: Subject to any disclaimer, the term of this patent is extended or adjusted under 35 U.S.C. 154(b) by 110 days.

(21) Appl. No.: 18/235,435

(22) Filed: Aug. 18, 2023

(65) Prior Publication Data

US 2024/0080015 A1 Mar. 7, 2024

(30) Foreign Application Priority Data

Aug. 31, 2022 (EP) .................................. 22306296

(51) Int. Cl.
*H02M 1/12* (2006.01)
*H02P 27/06* (2006.01)
*H03H 11/04* (2006.01)

(52) U.S. Cl.
CPC ............. *H03H 11/04* (2013.01); *H02P 27/06* (2013.01)

(58) Field of Classification Search
CPC ...... H02P 27/06; H02P 27/04; H02M 1/0077; H02M 5/14; H02M 7/08; H02M 7/81; H02M 1/007; H02M 5/458; H02M 7/17; H02M 7/06; H02J 3/01
See application file for complete search history.

(56) References Cited

U.S. PATENT DOCUMENTS

| | | | |
|---|---|---|---|
| 2013/0170257 A1* | 7/2013 | Ganev | H01F 30/02 363/64 |
| 2014/0139168 A1* | 5/2014 | Trainer | H02J 3/1878 318/500 |
| 2014/0204614 A1* | 7/2014 | Elam | H02M 1/126 363/16 |
| 2020/0052574 A1 | 2/2020 | Abdollahi | |

OTHER PUBLICATIONS

Singh, Bhim et al., "A Novel T-Connected Autotransformer-Based 18-Pulse AC-DC Converter for Harmonic Mitigation In Adjustable-Speed Induction-Motor Drives", IEEE Transactions on Industrial Electronics, vol. 54, No. 5, Oct. 1, 2007, pp. 2500-2511.

Singh, Bhim et al., "Multipulse AC-DC Converters for Improving Power Quality: A Review", IEEE Transactions on Power Electronics, vol. 23, No. 1, Jan. 1, 2008, pp. 260-281.

European Search Report and Search Opinion dated Feb. 14, 2023 for corresponding European Patent Application No. 22306296.9, 8 pages.

* cited by examiner

*Primary Examiner* — Muhammad S Islam
(74) *Attorney, Agent, or Firm* — Troutman Pepper Locke LLP (57) ABSTRACT

A harmonic filter including: a n-pulse transformer of a three-phase current, n being a multiple of 6; and n/6, or n/6-1, bridge rectifiers at the output of the n-pulse transformer.

8 Claims, 10 Drawing Sheets

HARMONIC FILTER WITH MULTI-FREQUENCY FILTERING CAPABILITIES

TECHNICAL FIELD

This disclosure pertains to the field of harmonic filters.

BACKGROUND ART

It is known that a number of electrical components pollute electrical networks by injecting harmonics in the network, which equipment connected to it behave erratically.

Examples of such electrical components are motor drives which consume electrical power to run a motor. More specifically, AC/DC converters of such drive generate harmonics in the electrical network.

Low Harmonics (LH) passive filters provide an inexpensive solution to filter harmonics at certain frequencies.

Figure 1:
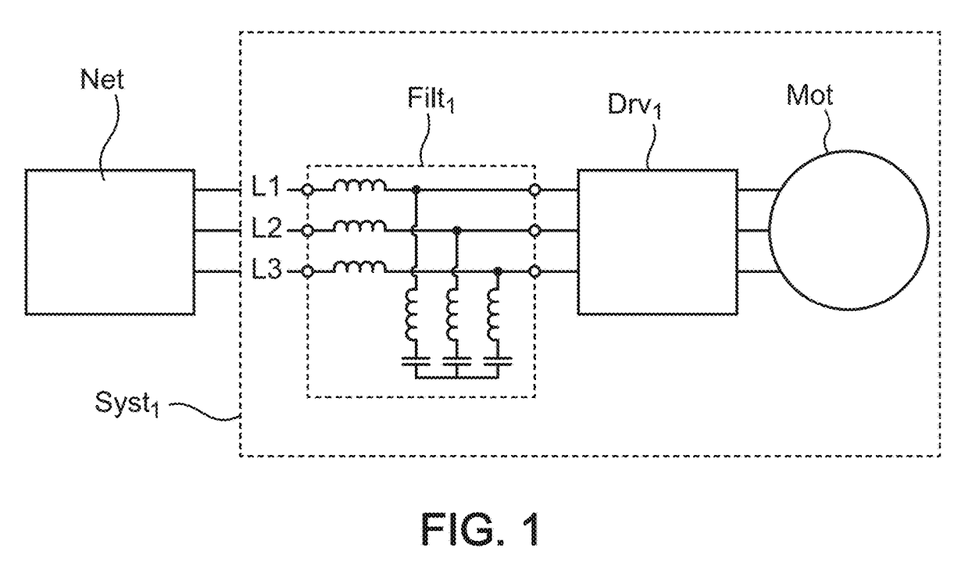
FIG. 1 represents an electric system comprising a low harmonic passive filter of the prior art.

FIG. 1 represents an electric system $Syst_1$ comprising a low harmonic passive filter $Filt_1$ of the prior art.

The electric system $Syst_1$ is connected to three-phase electric network Net. The three-phase electric network Net may be a public or a private (for example industrial or residential) electric network used to supply electrical power to various devices.

The electric system $Syst_1$ comprises a drive $Drv_1$ and a motor Mot. The drive $Drv_1$ aims at driving the motor at different frequencies.

The drive $Drv_1$ comprises two main stages:
an AC/DC converter;
an output stage which converts the DC power into AC power at different frequencies to run the motor Mot at different frequencies.

Therefore, the drive $Drv_1$ allows the motor Mot to run at different frequencies according to the operational needs, while the network Net operates at a unique frequency.

For example, even if the network Net has a fixed frequency of 50 Hz, the drive $Drv_1$ can run the motor Mot at different frequencies such as 35 Hz, 40 Hz. The drive $Drv_1$ may for example run the motor at any frequency in a range of [0, 1-600 Hz].

The AC/DC power conversion in the drive $Drv_1$ however generates harmonics that may pollute the network Net.

In order to avoid network pollution, the passive filter $Filt_1$ filters the harmonics so as to avoid pollution of the network Net by the harmonics generated by the drive $Drv_1$.

However, the passive filters such as the filter $Filt_1$ provide an efficient filtering at a defined frequency, or more generally in a narrow frequency band, but are not stable for other frequencies.

Figure 2A:
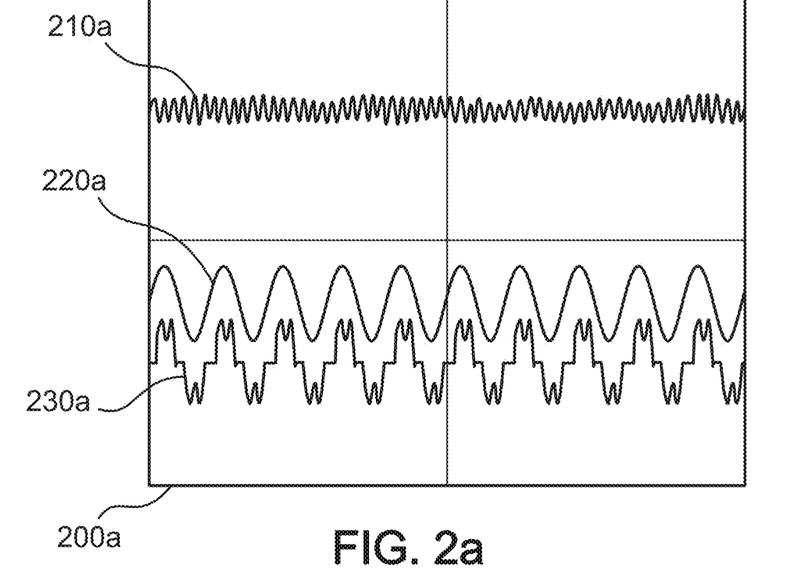
FIG. 2a represents a first example the harmonic distortion injected in the electric network by an, electric system comprising a drive which operates at 40 Hz, and a low harmonic passive filter of the prior art.
Figure 2B:
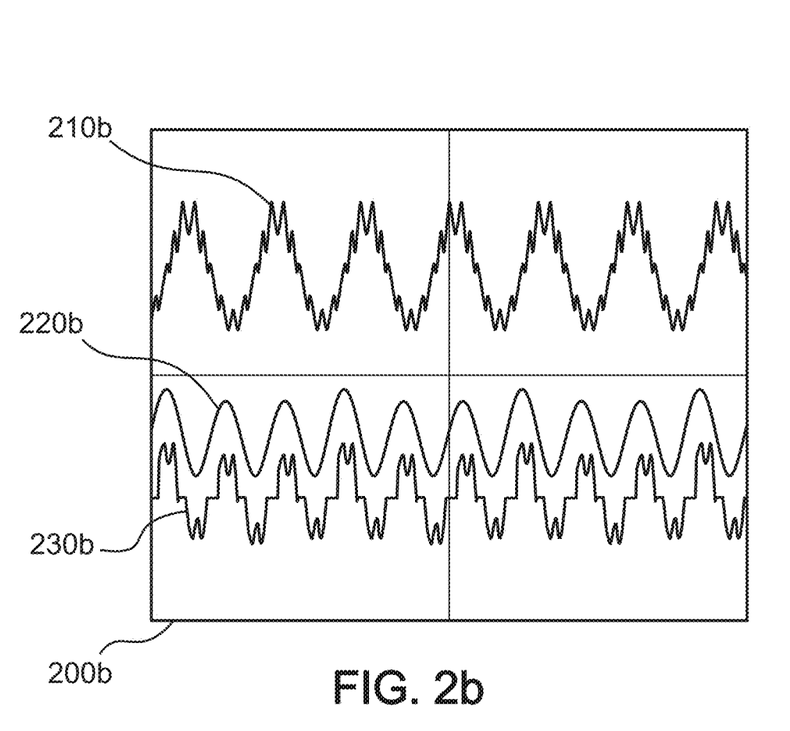
FIG. 2b a first example the harmonic distortion injected in the electric network by an, electric system comprising a drive which operates at 35 Hz, and a low harmonic passive filter of the prior art.

For example, the FIGS. 2a and 2b represent the harmonic distortion injected in the electric network when the drive operates at 40 Hz and 35 Hz respectively.

The curves 210a and 210b in graphs 200a and 200b represent respectively the DC bus voltage in the drive $Drv_1$ when the drive $Drv_1$ operates at 40 Hz and 35 Hz respectively.

The curves 220a and 220b in graphs 200a and 200b represent respectively the AC input voltage in the network Net when the drive $Drv_1$ operates at 40 Hz and 35 Hz respectively.

The curves 230a and 230b in graphs 200a and 200b represent respectively the AC input current in the network Net when the drive $Drv_1$ operates at 40 Hz and 35 Hz respectively.

The curve 210a shows that above 35-40 Hz, the DC bus voltage is stable, while the curve 210b shows that below 35-40 Hz, ripples come out in the come out and this can damage parts. and this can damage parts of the drive.

The curve 220a shows that limited harmonics are injected in the network Net: the passive filter $Filt_1$ provides an efficient filtering at 40 Hz. The total harmonic distortion (THDi) is in this case estimated to less than 10% or 5%. The stability of the network Net is therefore not affected by the system $Syst_1$.

On the contrary, the curve 220b shows that high harmonics are injected in the network Net when the drive operates at 35 Hz: the filtering is less efficient, and the THDi is much higher than 10%. The network Net can then become unstable due to the presence of polluting harmonics.

This example demonstrates that passive filters are not able to provide an efficient filtering on a large frequency band corresponding to the possible frequencies used to run the motor Mot. More generally, passive filters are not able to provide an efficient filtering of harmonics generated by an electric system, when the harmonics can be generated at different frequencies. Depending upon the frequency at which the motor runs, the passive filters can generate ripples in the DC bus voltage of the drive, and harmonics in the network.

Passive filters also provide additional drawbacks:
They are not compatible with synchronous motors;
The filtering varies with the load ratio of the motor.

Multiphase filters have been designed to overcome this issue, and perform an efficient harmonic filtering over a large frequency range. However, multiphase filters are cumbersome, heavy, and expensive.

There is therefore the need for a lightweight filter which is able to filter harmonics with a low total harmonic distortion over a large frequency range.

SUMMARY

This disclosure improves the situation.

It is proposed a harmonic filter comprising: a n-pulse transformer of a three-phase current, n being a multiple of 6; n/6 or n/6-1 bridge rectifiers at the output of the n-pulse transformer.

The harmonic filter allows performing a harmonic filtering with low total harmonic distortion on a large frequency band. Meanwhile, the harmonic filter is a lightweight filter which is both light and small.

Advantageously, the n-pulse transformer is a n-pulse autotransformer.

This allows the harmonic filter to have a further limited volume, because n-pulse autotransformer are especially compact devices.

Advantageously, the bridge rectifiers are diode bridges.

This allows current rectification for 2-quadrant applications.

Advantageously, the bridge rectifiers are thyristor bridges.

This allows current rectification for 4-quadrant applications.

Advantageously, said bridge rectifiers are disposed in series.

This allows dividing the voltage at the output of the harmonic filter by the number of bridge rectifiers.

Advantageously, said bridge rectifiers are disposed in parallel.

This allows dividing the current at the output of the harmonic filter by the number of bridge rectifiers.

Advantageously, n is selected to comply with a target maximum total harmonic distortion.

This ensures that a target maximum total harmonic distortion will be complied with.

In another aspect, it is proposed an electric system comprising: the harmonic filter according to one of the embodiments of the invention; a drive configured to deliver an alternative current to a motor at a variable frequency.

This allows ensuring that the variations of the frequencies delivered by the drive do not cause harmonic distortion due to the presence of the harmonic filter, whatever the frequency used to run the motor.

BRIEF DESCRIPTION OF DRAWINGS

Other features, details and advantages will be shown in the following detailed description and on the figures, on which.

DESCRIPTION OF EMBODIMENTS

Figure 3:
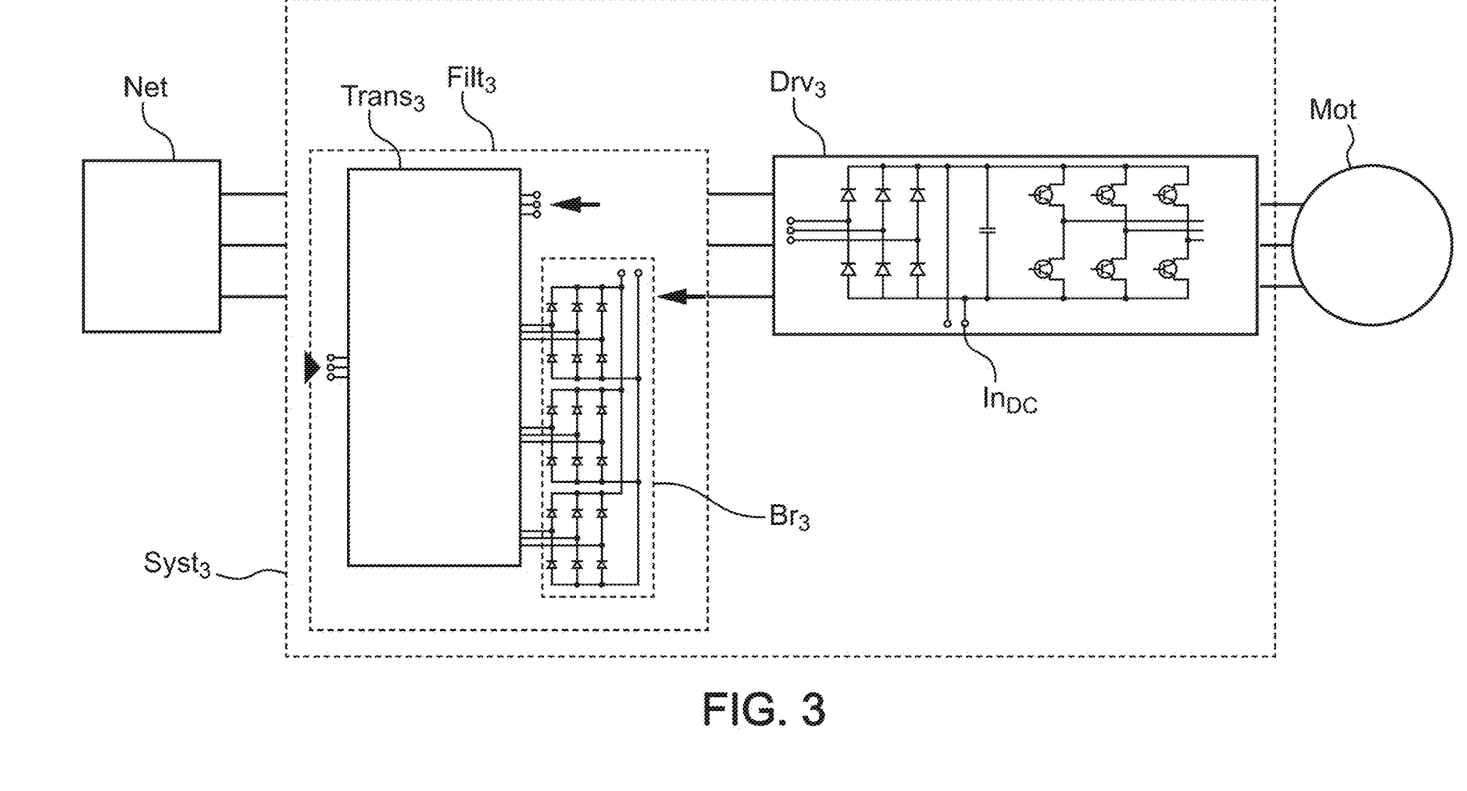
FIG. 3 represents a first example of an electric system comprising a harmonic filter in a number of embodiments of the invention.

It is now referred to FIG. 3.

The electric system $Syst_3$ is similar to the electric system $Syst_1$, but comprises, instead of a passive filter $Filt_1$, a harmonic filter $Filt_3$ in a number of embodiments of the invention.

The harmonic filter $Filt_3$ comprises:
  a n-pulse transformer $Trans_3$ of the three-phase current provided by the electric network Net, n being a multiple of 6;
  n/6-1 bridge rectifiers ($Br_3$) at the output of the n-pulse transformer Trans3.

Therefore, the harmonic filter $Filt_3$ is a two-stage harmonic filter.

The first stage is the n-pulse transformer $Trans_3$ which provides a transformation of the three-phase current provided by the electric network Net. n is a multiple of 6 and may for example be equal to 6, 12, 18, 24 . . . .

One of the key aspect of the invention is the use of n/6, or n/6-1 bridge rectifiers at the output of the n-pulse transformer.

In the example of FIG. 3, the second stage $Br_3$ is made of n/6-1 bridge rectifiers. This is because, the drive $Drv_3$ has a DC input $In_{DC}$ which provides access to one bridge rectifier in the drive $Drv_3$. Even if only n/6-1 bridge rectifiers are present in the harmonic filter, the total number of bridge rectifiers present (either in the harmonic filter itself, or in the drive) at the output of the n-pulse transformer must be equal to n/6 (e.g equal to 1 for a 6-pulse transformer, 2 for a 12-pulse transformer, 3 for a 18-pulse transformer, 4 for a 24-pulse transformer, et)

The harmonic filter $Filt_3$ allows performing a harmonic filtering with low total harmonic distortion on a large frequency band. Therefore, the variations of the frequencies delivered by the drive do not cause harmonic distortion due to the presence of the harmonic filter, whatever the frequency used to run the motor.

Furthermore, the harmonic filter is a lightweight filter which is both light and small. The harmonic filter $Filt_3$ is also inexpensive compared to a prior art multiphase filter.

According to various embodiments of the invention, the bridge rectifiers may for example diodes, thyristors or a combination thereof.

Diode bridge rectifiers are well suited for allowing current rectification for 2-quadrant applications.

Thyristor bridge rectifiers are well suited for allowing current rectification for 4-quadrant applications.

The bridge rectifiers may be either only diode bridges, only thyristor bridges, or a combination thereof.

In the example of FIG. 3, the bridge rectifiers are disposed in parallel.

This allows dividing the voltage at the output of the harmonic filter by the number of bridge rectifiers.

In other embodiments of the invention, the bridge rectifiers are disposed in series.

This allows dividing the current at the output of the harmonic filter by the number of bridge rectifiers. This is especially advantageous for low power and low voltage applications, for example devices having a power below 15 kW, because high current parts are common and cheap.

In a number of embodiments of the invention, the n-pulse transformer is a n-pulse autotransformer.

This allows the harmonic filter to have a further limited volume, because n-pulse autotransformer are especially compact devices.

The electric system $Syst_3$ is provided by means of example only of a use of a harmonic filter according to an embodiment of the invention. The invention is however not restricted to this example, and a harmonic filter in an embodiment of the invention can be used for filtering the harmonic generated by virtually any load that can be powered by an electric network. The drive $Drv_3$ is therefore provided as a non-limitative example only of a possible load that generate harmonic distortion. A harmonic filter according to the invention may for example be coupled to drives having other DC/AC converter topologies.

Figure 4:
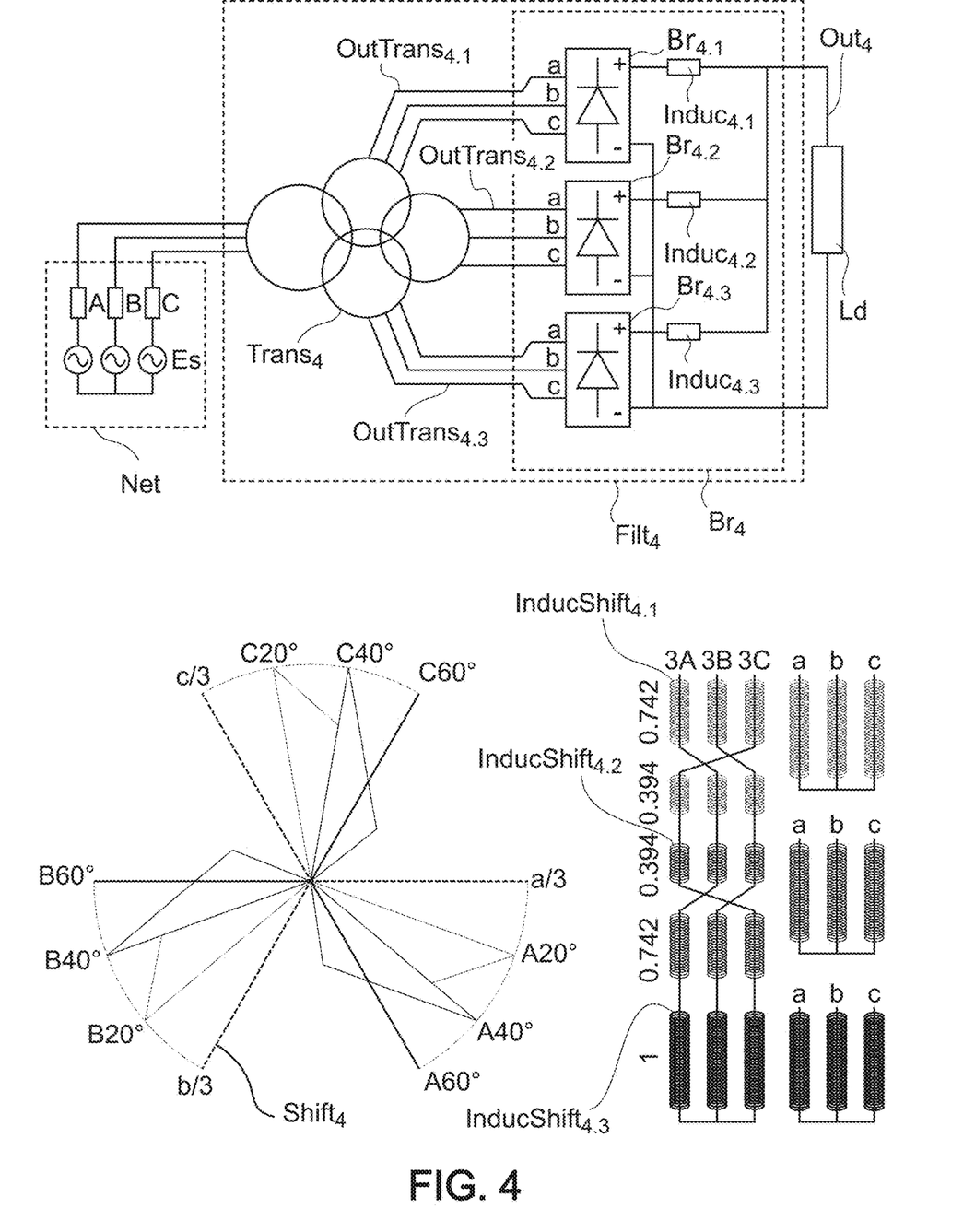
FIG. 4 represents a first example of harmonic filter comprising a 18-pulses transformer in a number of embodiments of the invention.

It is now referred to FIG. 4.

An exemplary harmonic filter $Filt_4$ in an embodiment of the invention comprises a 18-pulses transformer $Trans_4$, and a set $Br_4$ of 3 rectifier bridges $Br_{4.1}$, $Br_{4.2}$, and $Br_{4.3}$.

The network Net provides a three-phase currents with three phases a, b, c. The three phases a, b, c have a phase shift of 120°.

In a number of embodiments of the invention, the filter further may further comprise interphases inductances $Induc_{4.1}$, $Induc_{4.2}$ and $Induc_{4.3}$ at the output of the 3 rectifier bridges $Br_{4.1}$, $Br_{4.2}$, and $Br_{4.3}$. The interphase inductances may for example be present if the rectifier bridges are disposed in parallel as in FIG. 4.

The transformer has three outputs $OutTrans_{4.1}$, $OutTrans_{4.2}$ and $OutTrans_{4.3}$ which respectively serve as input to the 3 rectifier bridges $Br_{4.1}$, $Br_{4.2}$, and $Br_{4.3}$. Each of the three outputs $OutTrans_{4.1}$, $OutTrans_{4.2}$ and $OutTrans_{4.3}$ is a three-phase current having three phases a, b, c.

FIG. 4 further shows three exemplary phase shifter circuits $InducShift_{4.1}$, $InducShift_{4.2}$ and $InducShift_{4.3}$, respectively for the three outputs $OutTrans_{4.1}$, $OutTrans_{4.2}$ and $OutTrans_{4.3}$ in the transformer $Trans_4$. The phase shifter circuits are made of connected inductances. The number at the left of the phase shifter circuits, and the relative sizes of the inductance show the relative values of inductances. The phase shifter circuits $InducShift_{4.1}$, $InducShift_{4.2}$ and $InducShift_{4.3}$ therefore respectively produce a phase shift of 20°, 40° and 60° for each of the three phases a, b, c of the three outputs $OutTrans_{4.1}$, $OutTrans_{4.2}$ and $OutTrans_{4.3}$.

The diagram $Shift_4$ shows the phase shifts of the outputs of the transformer.

More specifically, the diagram $Shift_4$ shows:
- a/3: phase shift of the phase a of the current provided by network Net;
- a20°: phase shift of the phase a of the output $OutTrans_{4.1}$;
- a40°: phase shift of the phase a of the output $OutTrans_{4.2}$;
- a60°: phase shift of the phase a of the output $OutTrans_{4.3}$;
- b/3: phase shift of the phase b of the current provided by network Net;
- b20°: phase shift of the phase b of the output $OutTrans_{4.1}$;
- b40°: phase shift of the phase b of the output $OutTrans_{4.2}$;
- b60°: phase shift of the phase b of the output $OutTrans_{4.3}$;
- c/3: phase shift of the phase c of the current provided by network Net;
- c20°: phase shift of the phase c of the output $OutTrans_{4.1}$;
- c40°: phase shift of the phase c of the output $OutTrans_{4.2}$;
- c60°: phase shift of the phase c of the output $OutTrans_{4.3}$;

The diagram $Shift_4$ therefore shows that:
The three phases a, b, c of the current provided by network Net have respectively phase shifts of 120°;
Each phase a, b, c of the currents at each of the output of the transformer is respectively shifted by 20° from the corresponding phase of the three-phase current provided by the network Net.

Provided that the number of phases will be doubled at the output of the rectifiers, this allows obtaining, in total, 18 pulses respectively shifted by $$20° \left(\frac{\pi}{9}\right)$$

(at the output of the transformer.

This example is provided with respect with a 18 pulse transformer.

More generally, when a n-pulse autotransformer is used, the transformer has n outputs having each three phases a, b, c, and the outputs are shifted by $$\frac{\pi}{3*n}$$

with respect to the corresponding input of the network Net, in order to obtain a total of 6*n pulses per period, each pulse being shifted by $$\left(\frac{\pi}{3*n}\right)$$

The filter $Filt_4$ filters the harmonic generated by a electric load Ld powered by the network Net, and therefore prevents a pollution of the network net by the harmonics.

The point $Out_4$ represents the output of the filter $Filt_4$. For the sale of intelligibility of the figure, the output is represented as a single output, but the output of the filter is also a three-phase current having three phases a, b, c.

Figure 5:
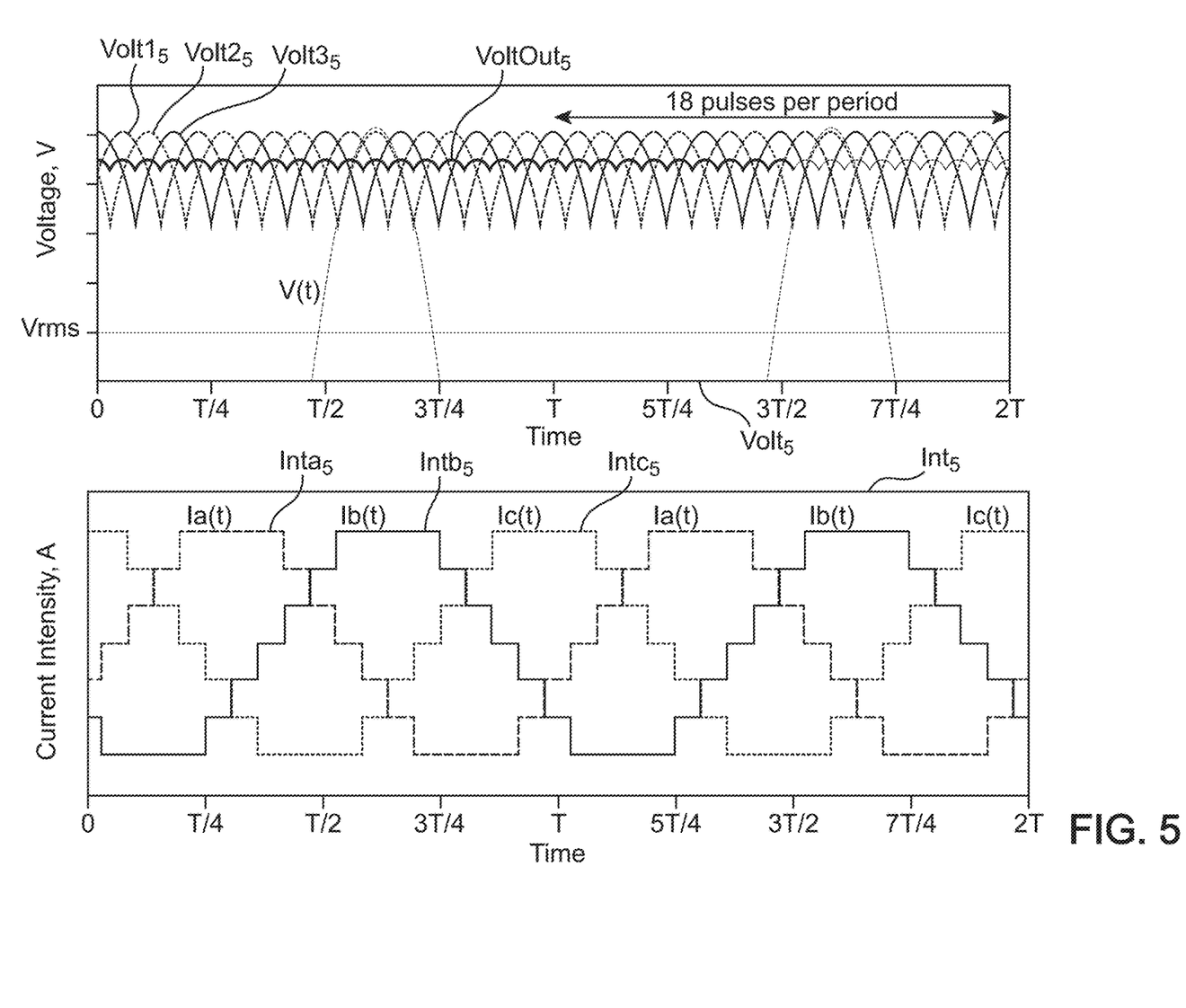
FIG. 5 represents examples of voltages and intensities at the output of a harmonic filter in a number of embodiments of the invention.

It is now referred to FIG. 5.

The graphs $Volt_5$ and $Int_5$ represent respectively the variations of voltage and current intensity in the harmonic filter $Filt_4$.

For each graph, the horizontal axis represents the time, expressed as fractions of a period T.

The vertical graphs represent:
For graph $Volt_5$, the variations of voltage over time;
For graph $Int_5$, the variations of current intensity over time.

In graph $Volt_5$, the curves represent:
$Volt1_5$, the voltage at the output of the rectifier bridge $Br_{4.1}$;
$Volt2_2$, the voltage at the output of the rectifier bridge $Br_{4.2}$;
$Volt3_5$, the voltage at the output of the rectifier bridge $Br_{4.3}$;
$VoltOut_5$, the voltage at the output $Out_4$ of the filter $Filt_4$ It is apparent that the voltage $VoltOut_5$ has 18 pulses per period T.

Meanwhile, in graph $Int_5$, the curves represent:
$Inta_5$, the current intensities at the phase a of the output $Out_4$ of the filter $Filt_4$;
$Intb_5$, the current intensities at the phase b of the output $Out_4$ of the filter $Filt_4$;
$Intc_5$, the current intensities at the phase c of the output $Out_4$ of the filter $Filt_4$.

Figure 6:
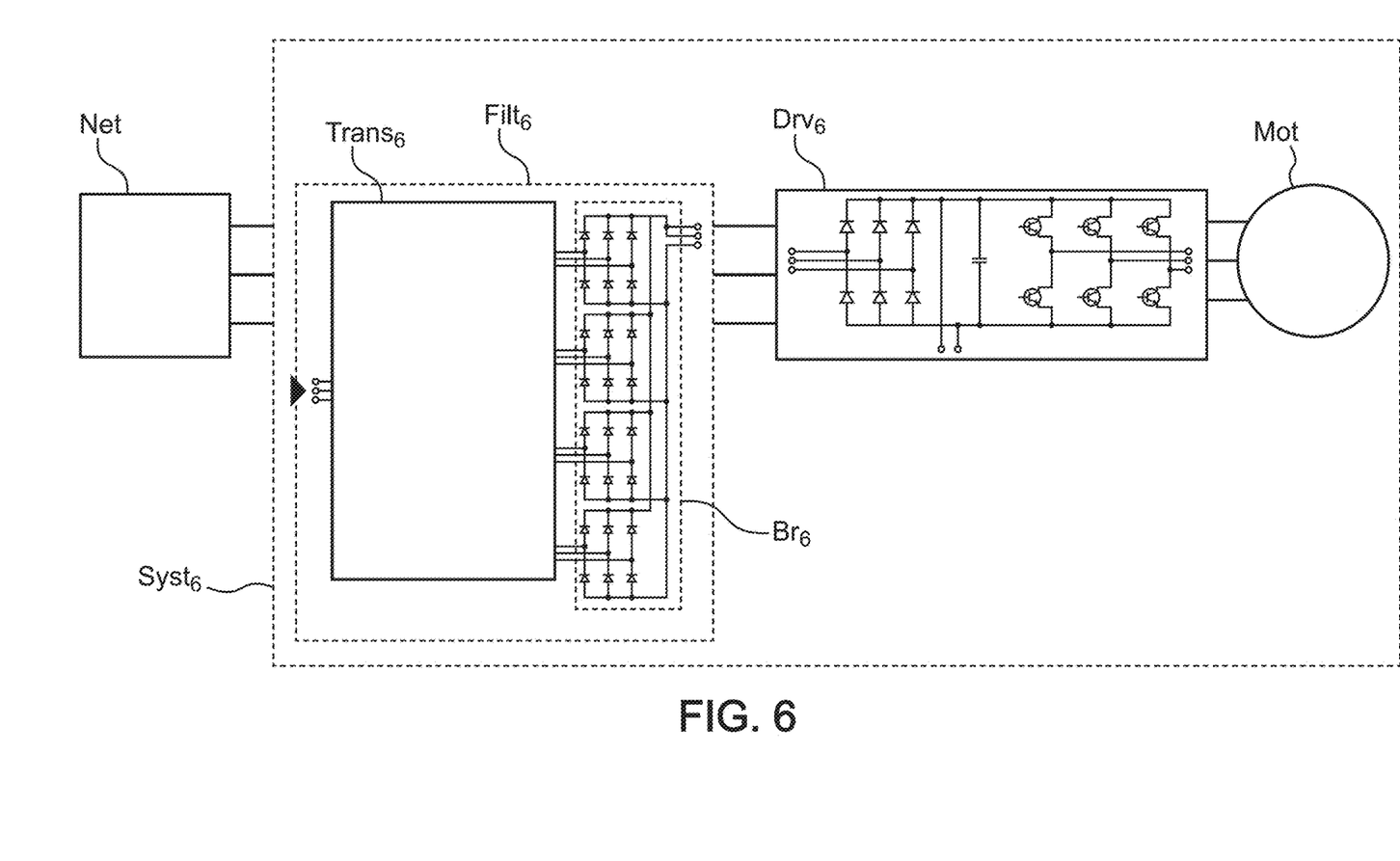
FIG. 6 represents a second example of an electric system comprising a harmonic filter in a number of embodiments of the invention.

It is now referred to FIG. 6.

The electric system $Syst_6$ is similar to the electric system $Syst_6$, with a harmonic filter $Filt_6$ made of a first stage comprising a transformer $Trans_6$, and a second stage $Br_6$ of bridge rectifiers, and a drive $Drv_6$ to run a motor at different frequencies, the only differences being that:
The second stage $Br_6$ comprises n bridge rectifiers;
The drive $Drv_6$ has no DC input, and therefore no bridge rectifier.

Therefore, despite these differences, the electric system $Syst_6$ comprises, like the electric system $Syst_3$, n bridge rectifiers at the output of the transformer.

Figure 7:
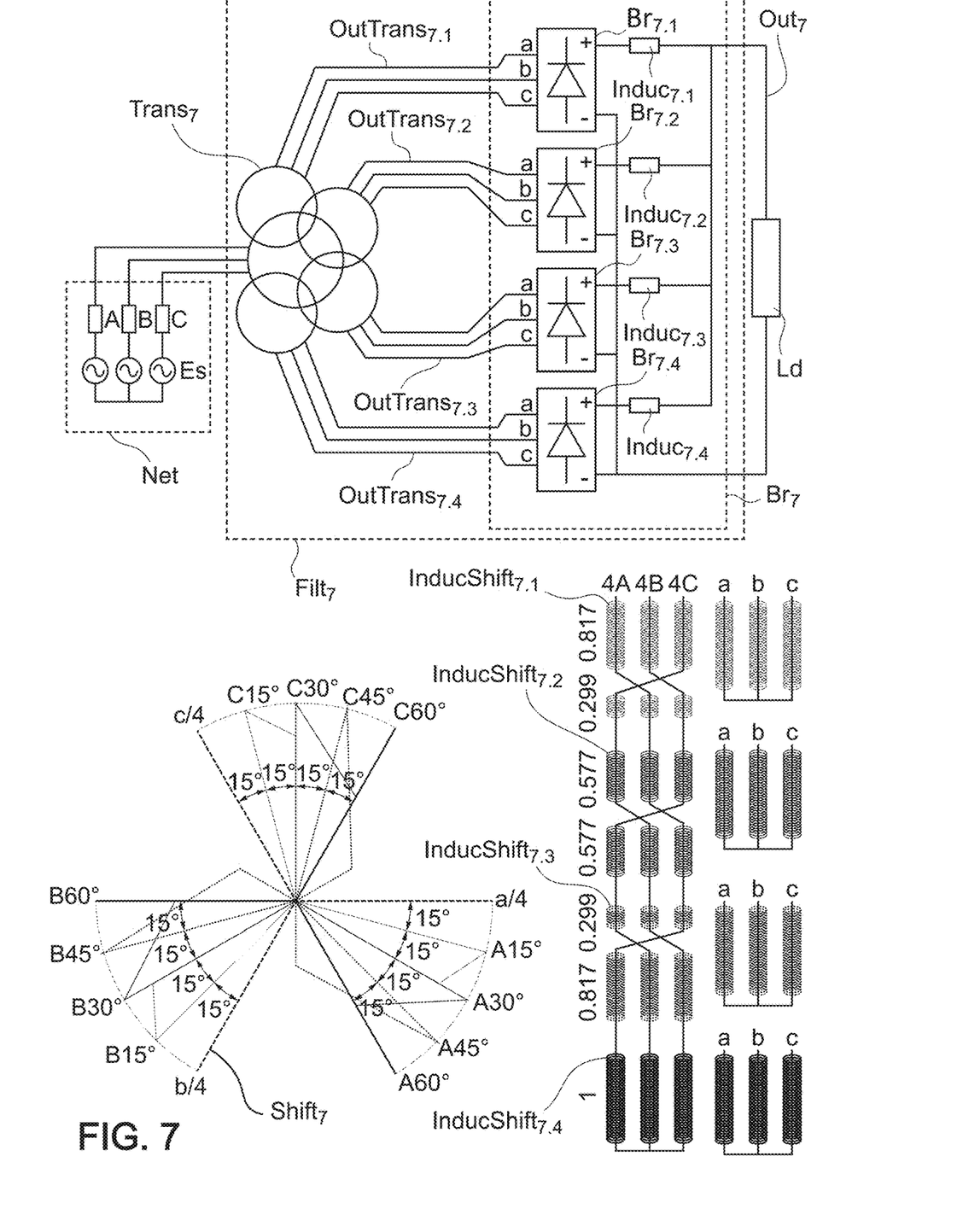
FIG. 7 represents a second example of harmonic filter comprising a 24-pulses transformer in a number of embodiments of the invention.

It is now referred to FIG. 7.

An exemplary harmonic filter $Filt_7$ in an embodiment of the invention comprises a 24-pulses transformer $Trans_7$, and a set $Br_7$ of 4 rectifier bridges $Br_{7.1}$, $Br_{7.2}$, $Br_{7.3}$, and $Br_{7.4}$. The network Net provides a three-phase currents with three phases a, b, c. The three phases a, b, c have a phase shift of 120°.

In a number of embodiments of the invention, the filter further may further comprise interphases inductances $Induc_{7.1}$, $Induc_{7.2}$ and $Induc_{7.3}$ and $Induc_{7.4}$ at the output of the 4 rectifier bridges $Br_{7.1}$, $Br_{7.2}$, $Br_{7.3}$, and $Br_{7.4}$. The interphase inductances may for example be present if the rectifier bridges are disposed in parallel as in FIG. 7.

The transformer has four outputs $OutTrans_{7.1}$, $OutTrans_{7.2}$, $OutTrans_{7.3}$ and $OutTrans_{7.4}$ which respectively serve as input to the 4 rectifier bridges $Br_{7.1}$, $Br_{7.2}$, $Br_{7.3}$, and $Br_{7.4}$. Each of the four outputs $OutTrans_{7.1}$, $OutTrans_{7.2}$, $OutTrans_{7.3}$ and $OutTrans_{7.4}$ is a three-phase current having three phases a, b, c.

FIG. 7 further shows three exemplary phase shifter circuits $InducShift_{7.1}$, $InducShift_{7.2}$, $InducShift_{7.3}$, and $InducShift_{7.4}$, respectively for the four outputs $OutTrans_{7.1}$, $OutTrans_{7.2}$, $OutTrans_{7.3}$ and $OutTrans_{7.4}$ in the transformer $Trans_7$. The phase shifter circuits are made of connected inductances. The number at the left of the phase shifter circuits, and the relative sizes of the inductance show the relative values of inductances. The phase shifter circuits $InducShift_{7.1}$, $InducShift_{7.2}$, $InducShift_{7.3}$, and $InducShift_{7.4}$ therefore respectively produce a phase shift of 15°, 30°, 45° and 60° for each of the three phases a, b, c of the four outputs $OutTrans_{7.1}$, $OutTrans_{7.2}$, $OutTrans_{7.3}$ and $OutTrans_{7.4}$.

The diagram $Shift_7$ shows the phase shifts of the outputs of the transformer.

More specifically, the diagram $Shift_4$ shows:
a/3: phase shift of the phase a of the current provided by network Net;
a15°: phase shift of the phase a of the output $OutTrans_{7.1}$;
a30°: phase shift of the phase a of the output $OutTrans_{7.2}$;
a45°: phase shift of the phase a of the output $OutTrans_{7.3}$;
a60°: phase shift of the phase a of the output $OutTrans_{7.4}$;
b/3: phase shift of the phase b of the current provided by network Net;
b15°: phase shift of the phase b of the output $OutTrans_{7.1}$;
b30°: phase shift of the phase b of the output $OutTrans_{7.2}$;
b45°: phase shift of the phase b of the output $OutTrans_{7.3}$;
b60°: phase shift of the phase b of the output $OutTrans_{7.4}$;
c/3: phase shift of the phase c of the current provided by network Net;
c15°: phase shift of the phase c of the output $OutTrans_{7.1}$;
c30°: phase shift of the phase c of the output $OutTrans_{7.2}$;
c45°: phase shift of the phase c of the output $OutTrans_{7.3}$;
c60°: phase shift of the phase c of the output $OutTrans_{7.4}$.

The diagram $Shift_7$ therefore shows that:
The three phases a, b, c of the current provided by network Net have respectively phase shifts of 120°;
Each phase a, b, c of the currents at each of the output of the transformer is respectively shifted by 15° from the corresponding phase of the three-phase current provided by the network Net.

This allows obtaining, in total, 24 pulses respectively shifted by $$15°\left(\frac{\pi}{12}\right)$$

at the output of the transformer.

This example is provided with respect with a 24 pulse transformer.

More generally, and as already stated with reference to the FIG. 4, when a n-pulse autotransformer is used, the transformer has n outputs having each three phases a, b, c, and the outputs are shifted by $$\frac{\pi}{3*n}$$

with respect to the corresponding input of the network Net, in order to obtain a total of 6*n pulses per period, each pulse being shifted by $$\left(\frac{\pi}{3*n}\right)$$

The filter $Filt_7$ filters the harmonic generated by a electric load Ld powered by the network Net, and therefore prevents a pollution of the network net by the harmonics.

The point $Out_7$ represents the output of the filter $Filt_7$. For the sale of intelligibility of the figure, the output is represented as a single output, but the output of the filter is also a three-phase current having three phases a, b, c.

Figure 8:
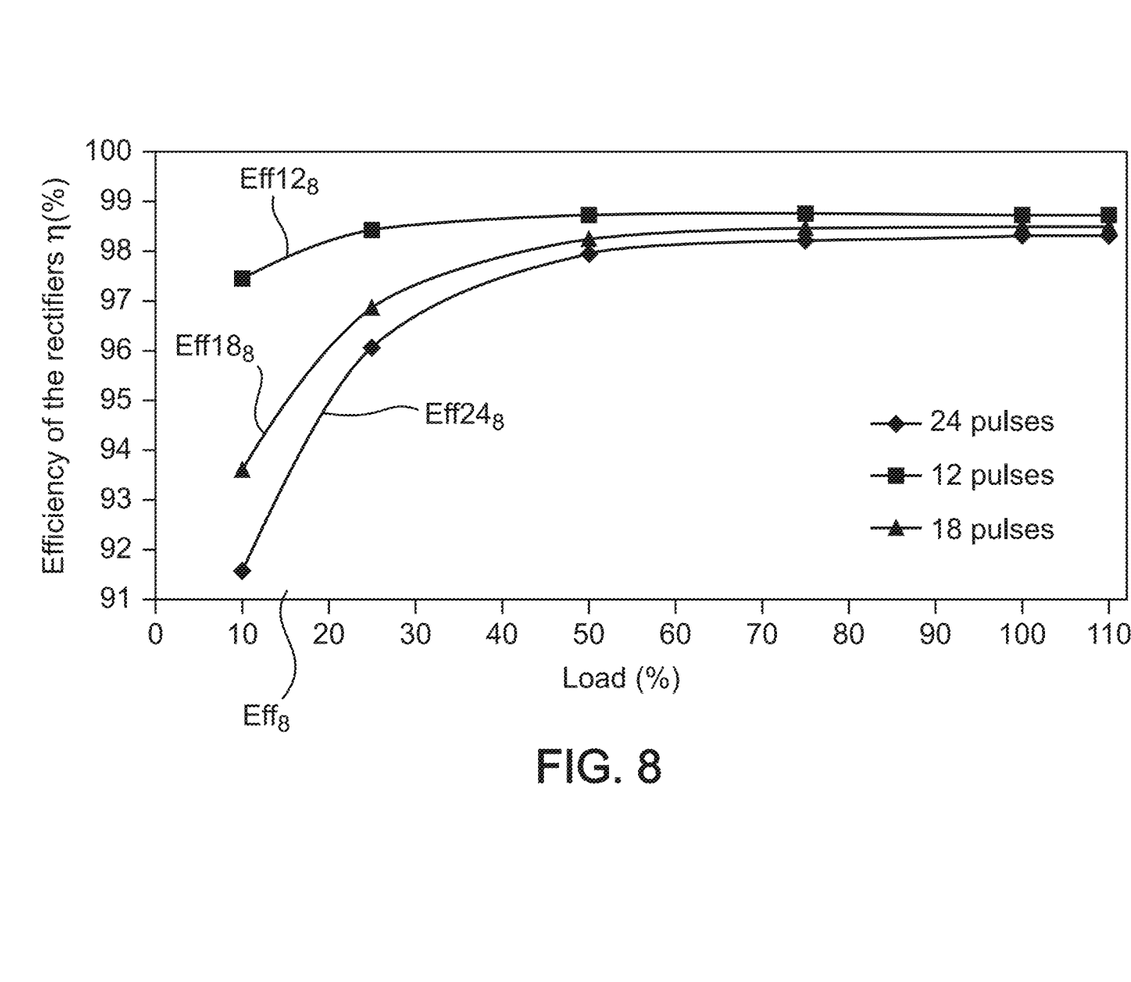
FIG. 8 represents an exemplary evolution of the efficiency of the rectifiers depending upon the load of for harmonic filters in a number of embodiments of the invention.

It is now referred to FIG. 8.

The graph $Eff_8$ represents an exemplary evolution of the efficiency of the rectifiers depending upon the load of for harmonic filters in a number of embodiments of the invention.

The horizontal axis represents the load, in percentage of its power rating.

The vertical axis represents the efficiency of the rectifiers, in percentage.

The three curves represent respectively the efficiency of the rectifiers in function of the load, for:
Curve $Eff24_8$: 24-pulses transformer;
Curve $Eff18_8$: 18-pulses transformer;
Curve $Eff12_8$: 12-pulses transformer.

The FIG. 8 shows that the efficiency of the rectifier is high in all scenarios, increases with the load, and is higher for a low number of pulses.

Figure 9:
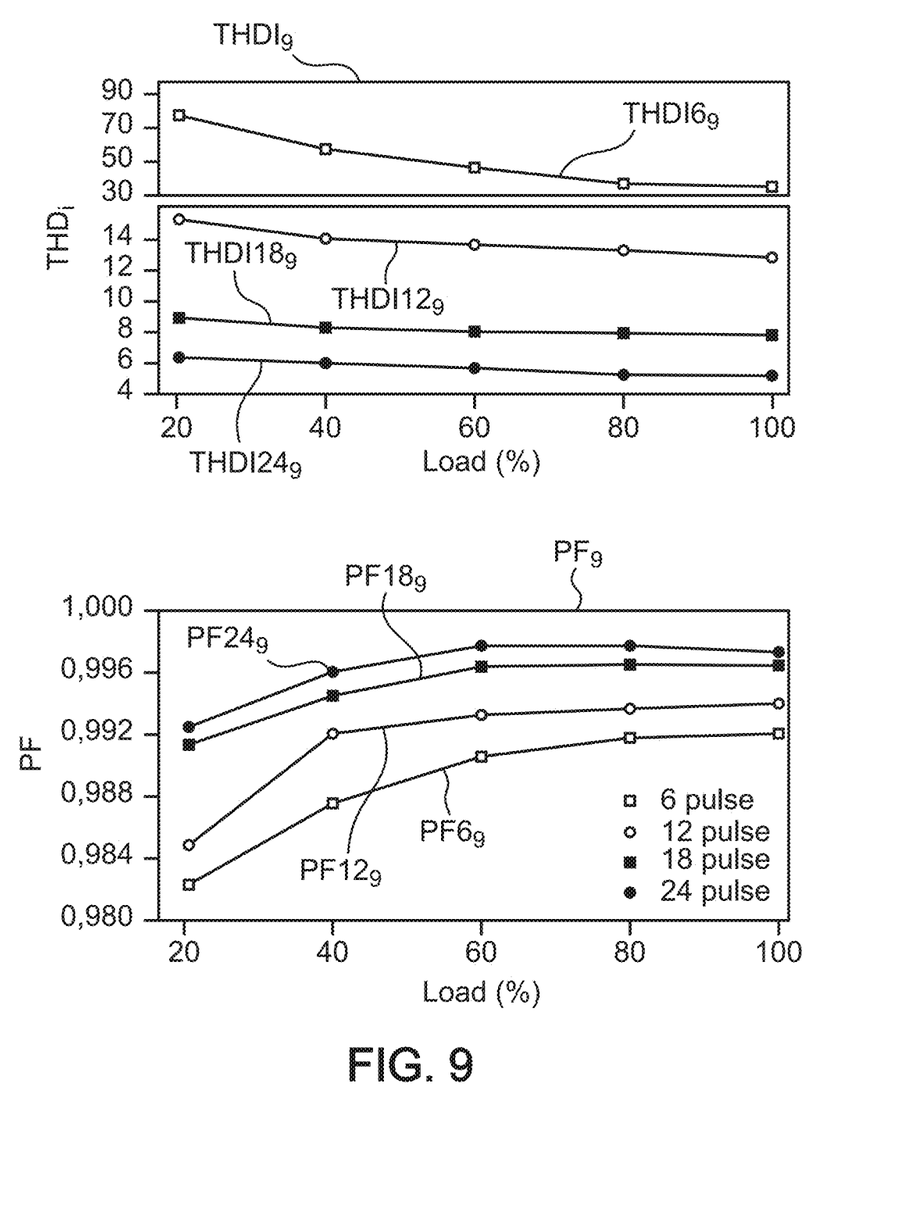
FIG. 9 represents an exemplary evolution of a total harmonic distortion and PF according to the load for harmonic filters in a number of embodiments of the invention.

It is now referred to FIG. 9.

The graph $THDI_9$ represents an exemplary evolution of the total harmonic distorsion depending upon the load for exemplary harmonic filters in a number of embodiments of the invention.

The horizontal axis represents the load, in percentage of its power rating.

The vertical axis represents the efficiency of the total harmonic distortion of the harmonic filter, in percentage.

The four curves represent respectively the total harmonic distortion (THDi) of an exemplary harmonic filter in an embodiment of the invention as a function of the load, for:
Curve $THDI24_9$: 24-pulses transformer;
Curve $THDI18_9$: 18-pulses transformer;
Curve $THDI12_9$: 12-pulses transformer;
Curve $THDI6_9$: 6-pulses transformer.

The graph $THDI_9$ shows that it is possible to evaluate the total harmonic distortion of the harmonic filter as a function of number of pulses and load, and that, for a given load, different values of the number of pulses provide significantly different harmonic distortions.

Depending upon the applications, the harmonic filter may comply with a target maximum total harmonic distortion. For example, a given network may allow a maximum total harmonic distortion of 5%, 10%, etc.

Therefore, it is possible to select the value of n, and therefore a specific transformer, to comply with a target maximum total harmonic distortion.

This ensures that a target maximum total harmonic distortion will be complied with.

More specifically, it is possible to select the lower number n which complies with the target maximum total harmonic distortion, in order to obtain a harmonic filter which is as light and inexpensive as possible, while complying with the target maximum THDi.

In the example of FIG. 9:
- If a target maximum THDi of 10% is sought at 100% load, it is complied with by a harmonic filter having a 18-pulses transformer, or a 24-pulses transformer?A 18-pulses transformer can therefore be selected in order to be as light and inexpensive as possible;
- If a target maximum THDi of 5% is sought at 100% load, it is complied only with a 24-pulses transformer. A 24-pulses transformer can therefore be selected in order to comply with the target THDi.

The graph $PFI_9$ represents an exemplary evolution of the Power Factor (PF) depending upon the load for exemplary harmonic filters in a number of embodiments of the invention.

The horizontal axis represents the load, in percentage.

The vertical axis represents the PF.

The four curves represent respectively the total harmonic distortion (PF) of an exemplary harmonic filter in an embodiment of the invention as a function of the load, for:
- Curve $PF24_9$: 24-pulses transformer;
- Curve $PF18_9$: 18-pulses transformer;
- Curve $PF12_9$: 12-pulses transformer;
- Curve $PF6_9$: 6-pulses transformer.

Figure 10:
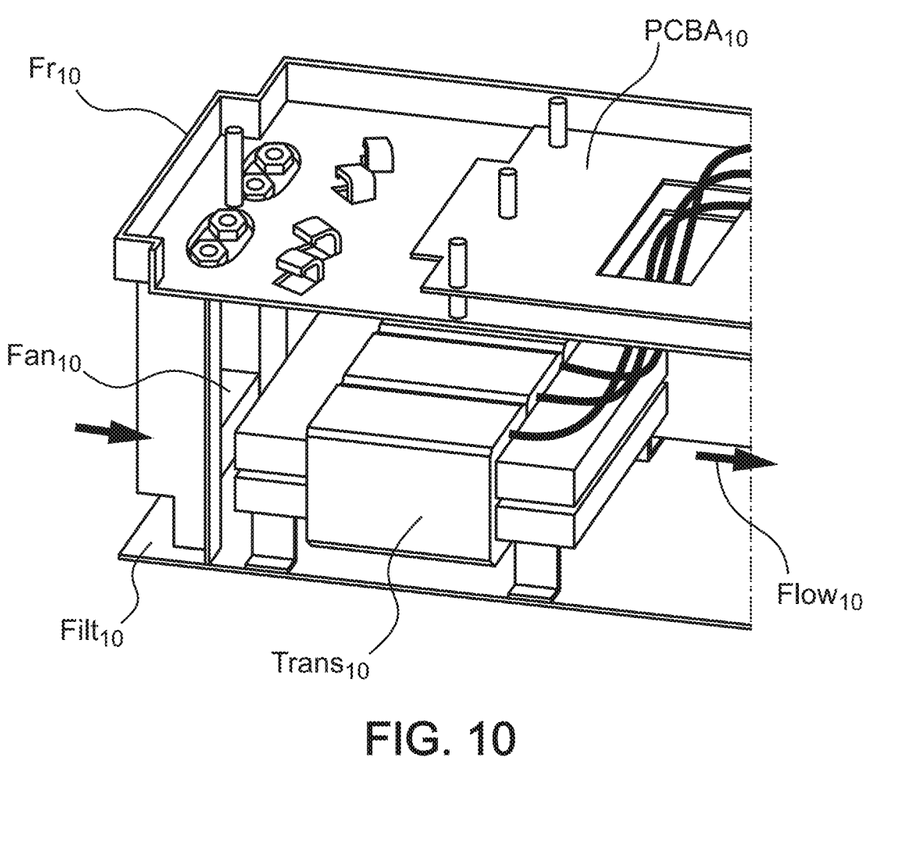
FIG. 10 represents an exemplary physical structure of a harmonic filter in a number of embodiments of the invention.

It is now referred to FIG. 10.

FIG. 10 represents an exemplary physical structure of a harmonic filter in a number of embodiments of the invention.

The filter $Filt_{10}$ comprises a frame $Fr_{10}$ which encompasses a n-pulse transformer $Trans_{10}$ and a set of n/6 or n/6-1 rectifier bridges on a printed board $PCBA_{10}$.

The board $PCBA_{10}$ is equipped with a heatsink to evacuate the heat generated by the rectifier bridges. The frame further comprises a fan $Fan_{10}$ to generate an air flow $Flow_{10}$ which allows evacuating the heat from the transformer $Trans_{10}$ and the heatsink.

The filter $Filt_{10}$ is provided by means of non-limitative example only of a physical structure of a harmonic filter in a number of embodiments of the invention. A harmonic filter in a number of embodiments of the invention may take many different structures and forms other than the structure of $Filt_{10}$.

This disclosure is not limited to the harmonic filters and electric systems described here, which are only example 13s. The invention encompasses every alternative that a person skilled in the art would envisage when reading this text.

The invention claimed is:

1. A harmonic filter comprising:
   an n-pulse transformer of a three-phase current, n being a multiple of 6; and
   n/6, or n/6-1, bridge rectifiers at the output of the n-pulse transformer.

2. The harmonic filter of claim 1, wherein the n-pulse transformer is a n-pulse autotransformer.

3. The harmonic filter of claim 1, wherein the bridge rectifiers are diode bridges.

4. The harmonic filter of claim 1, wherein the bridge rectifiers are thyristor bridges.

5. The harmonic filter of claim 1, wherein said bridge rectifiers are disposed in series.

6. The harmonic filter of claim 1, wherein said bridge rectifiers are disposed in parallel.

7. The harmonic filter of claim 1, wherein n is selected to comply with a target maximum total harmonic distortion.

8. An electric system comprising:
   the harmonic filter of claim 1; and
   a drive configured to deliver an alternative current to a motor at a variable frequency.

* * * * *